(12) United States Patent
Furuta et al.

(10) Patent No.: US 11,450,139 B2
(45) Date of Patent: Sep. 20, 2022

(54) PROTECTIVE FILM FOR OLED DISPLAY WITH FINGERPRINT RECOGNITION SYSTEM

(71) Applicant: KEIWA Inc., Tokyo (JP)

(72) Inventors: Akira Furuta, Tokyo (JP); Koji Teramoto, Tokyo (JP)

(73) Assignee: Keiwa Inc., Tokyo (JP)

(*) Notice: Subject to any disclaimer, the term of this patent is extended or adjusted under 35 U.S.C. 154(b) by 56 days.

(21) Appl. No.: 16/857,071

(22) Filed: Apr. 23, 2020

(65) Prior Publication Data

US 2020/0342200 A1    Oct. 29, 2020

(30) Foreign Application Priority Data

Apr. 25, 2019 (JP) .............................. JP2019-084220

(51) Int. Cl.
| | |
|---|---|
| *G06V 40/13* | (2022.01) |
| *H01L 27/32* | (2006.01) |
| *H01L 51/52* | (2006.01) |
| *H01L 27/146* | (2006.01) |

(52) U.S. Cl.
CPC ...... *G06V 40/1329* (2022.01); *G06V 40/1318* (2022.01); *H01L 27/323* (2013.01); *H01L 27/3244* (2013.01); *H01L 51/5281* (2013.01); *H01L 27/14678* (2013.01)

(58) Field of Classification Search
CPC ..... G06K 9/0004; G06F 3/042; H01L 27/323; H01L 27/3244; H01L 51/5281
See application file for complete search history.

(56) References Cited

U.S. PATENT DOCUMENTS

| | | | |
|---|---|---|---|
| 2009/0016209 | A1 | 1/2009 | Ikeda et al. |
| 2009/0128759 | A1* | 5/2009 | Yoshimi ............ G02F 1/133634 349/118 |
| 2010/0220266 | A1* | 9/2010 | Kashima ................ G02B 1/105 349/96 |
| 2010/2200266 | | 9/2010 | Kashima et al. |
| 2012/0242635 | A1 | 9/2012 | Erhart et al. |
| 2013/0235456 | A1 | 9/2013 | Um et al. |
| 2016/0308170 | A1 | 10/2016 | Kim et al. |
| 2018/0005006 | A1* | 1/2018 | Chai ..................... G06K 9/2027 |
| 2018/0129317 | A1 | 5/2018 | Ryu et al. |
| 2018/0149792 | A1 | 5/2018 | Lee et al. |
| 2018/0157125 | A1* | 6/2018 | Yasui ...................... G02B 1/16 |
| 2019/0050095 | A1* | 2/2019 | Schwartz ................ G06F 3/042 |
| 2019/0138122 | A1 | 5/2019 | Ryu et al. |
| 2019/0303640 | A1 | 10/2019 | Song et al. |

(Continued)

FOREIGN PATENT DOCUMENTS

| | | |
|---|---|---|
| CN | 101799564 A | 11/2010 |
| CN | 107305411 A | 10/2017 |
| CN | 107358216 A | 11/2017 |

(Continued)

*Primary Examiner* — Yuzhen Shen
(74) *Attorney, Agent, or Firm* — Knobbe, Martens, Olson & Bear, LLP (57) ABSTRACT

A protective film covers the surface of a cover member in an OLED display with a fingerprint recognition system. The protective film includes a base layer with an in-plane retardation value of 25 nm or less. A hard coat layer may be formed on a surface of the base layer. The surface is a surface farther from the cover member.

10 Claims, 5 Drawing Sheets

(56) References Cited

U.S. PATENT DOCUMENTS

2019/0346606 A1\* 11/2019 Mashima ............. G02B 5/3033
2021/0109271 A1\* 4/2021 Tomohisa ........... H01L 51/5281

FOREIGN PATENT DOCUMENTS

| CN | 108062176 A | 5/2018 |
| JP | 2018088248 A | 6/2018 |
| KR | 10-2007-0099009 A | 10/2007 |
| KR | 10-2016-0123557 | 10/2016 |
| KR | 10-2018-0061523 A | 6/2018 |
| KR | 10-2019-0037861 A | 4/2019 |

\* cited by examiner

PROTECTIVE FILM FOR OLED DISPLAY WITH FINGERPRINT RECOGNITION SYSTEM

CROSS-REFERENCE TO RELATED APPLICATION

This application claims priority to Japanese Patent Application No. 2019-084220 filed on Apr. 25, 2019, the entire disclosure of which is incorporated by reference herein.

BACKGROUND

The present disclosure relates to a protective film for an organic light-emitting diode (OLED) display including a fingerprint recognition system.

In recent years, an increasing number of models of various information devices such as smartphones and tablet terminals have required fingerprint recognition to lock and unlock the devices on an OLED display (see, e.g., Japanese Unexamined Patent Publication No. 2018-88248).

An optical fingerprint recognition system that performs optical personal identification utilizing fingerprints employs a light-emitting diode (LED) as a light source that irradiates a recognition target with light, and an image sensor to read reflected light from a fingerprint surface.

In an OLED display with such an optical fingerprint recognition system, a cover glass is laminated on an OLED panel with a circular polarizer interposed therebetween which reduces reflection of external light.

Meanwhile, if a user drops an OLED display (or an information device with an OLED display, hereinafter, simply referred to as a "device") or presses the cover glass firmly, the cover glass may be broken and its scattered fragments may damage the device or the OLED display.

In order to reduce such the break of a cover glass or the scatter of its fragments at the break, a protective film such as a polyethylene terephthalate (PET) film covers the surface of the cover glass.

SUMMARY

A PET film used as a protective film for a typical fingerprint recognition system is uniaxially oriented and thus has a high in-plane retardation value (Re), which causes a phase difference due to birefringence. Accordingly, in an optical fingerprint recognition system utilizing a difference in the amount of light reflected by a fingerprint, the positional relationship between a protective film and a circular polarizer may change the amount of light received by an image sensor to cause erroneous recognition.

In addition, in order to reduce such erroneous recognition, there is a need to specify the angle in punching a base material for the protective film in a size corresponding to a device to be used and to align the orientation axis of the film with the optical axis of the circular polarizer. This causes a punching loss (unusable part) of about 30% to 40%. A tolerance in the punching processing or a tolerance of the orientation axis of the film, for example, may cause defective products with the misalignment between the orientation axis of the film and the optical axis of the circular polarizer, which leads to the problem of a lower yield.

To address the problems, it is an objective of the present disclosure to provide a protective film for an OLED display with a fingerprint recognition system that reduces erroneous recognition and has a high production efficiency.

In order to achieve the objective, a protective film for an organic light-emitting diode (OLED) display with a fingerprint recognition system of the present disclosure covers a surface of a cover member. The protective film includes a base layer with an in-plane retardation value of 25 nm or less.

In the protective film for an OLED display with a fingerprint recognition system of the present disclosure, the base layer has the significantly low in-plane retardation value of 25 nm or less, which hardly causes a phase difference due to birefringence. Even if the film is used as a protective film for a fingerprint recognition system, the amount of the light received by an image sensor hardly changes, thereby reducing erroneous recognition. In addition, the low in-plane retardation value reduces the influence of the dependency on the orientation of a base layer. There is thus no need to specify the angle in punching a base material for the base layer in a size corresponding to a device to be used and to align the orientation axis of the film with the optical axis of the circular polarizer. This causes a less punching loss (unusable part). In addition, defective products attributed to a tolerance of the orientation axis of the film rarely occur, which can reduce the risk of low yield.

In the protective film of the present disclosure, the fingerprint recognition system may include a light source configured to irradiate a recognition target with light, and an image sensor configured to receive reflected light from the recognition target. The OLED display may include an OLED panel and a circular polarizer above a top of the OLED panel. The cover member may be located above the circular polarizer. The fingerprint recognition system may be located below the OLED panel.

In this way, the OLED display with the fingerprint recognition system has a simple configuration. The OLED display with the fingerprint recognition system employing the protective film of the present disclosure assumes that the side viewed by a user is the upper side, whereas the opposite is the lower side.

The protective film of the present disclosure may further include an adhesive layer formed on a first surface of the base layer, the first surface being closer to the cover member.

This facilitates attachment of the protective film to the cover member.

The protective film of the present disclosure may further include a hard coat layer formed on a second surface of the base layer, the second surface being farther from the cover member.

This increases the strength of the protective film.

In protective film of the present disclosure, the base layer may contain a polycarbonate-based resin, an acrylic-based resin, a cycloolefin-based resin, or a polyester-based resin as a main component. The "main component" means the component included at the highest percentage by mass (e.g., 50% by mass or more).

This configuration allows production of a protective film with a low in-plane retardation value using a known method such as a T-shaped die.

If a protective film is formed by laminating a hard coat layer or an adhesive layer, for example, on a base layer, application of heat or a tension to the base layer in the lamination step changes the in-plane retardation value of the base layer. Needless to mention, the "in-plane retardation value of the base layer" in the present disclosure means the "in-plane retardation value of the base layer" after the formation of the protection film through this lamination step.

On the other hand, the hard coat layer and the adhesive layer are amorphous without orientation and thus do not change the in-plane retardation value basically. In other words, the in-plane retardation value of the protective film, as a whole, which is formed by laminating the hard coat layer, the adhesive layer, or any other layer on the base layer, is substantially equal to the "in-plane retardation value of the base layer."

It is also needless to mention, if a protective film is formed by laminating a plurality of base layers, the "in-plane retardation value of the base layer" in the present disclosure means the total in-plane retardation value of all the base layers constituting the protective film. For example, assume that a protective film is formed by laminating a hard coat layer, a first base layer, an adhesive layer, and a second base layer in this order from above. In this case, the "in-plane retardation value of the base layer" is the sum of the in-plane retardation values of the first and second base layers.

As described above, the present disclosure provides a protective film for an OLED display with a fingerprint recognition system that reduces erroneous recognition and has a high production efficiency.

DETAILED DESCRIPTION

Now, a protective film for an OLED display with a fingerprint recognition system according to an embodiment of the present disclosure will be described with reference to the drawings. The scope of the present disclosure is not limited to the following embodiment. Any modification may be made within the spirit and scope of the present disclosure.

Figure 1:
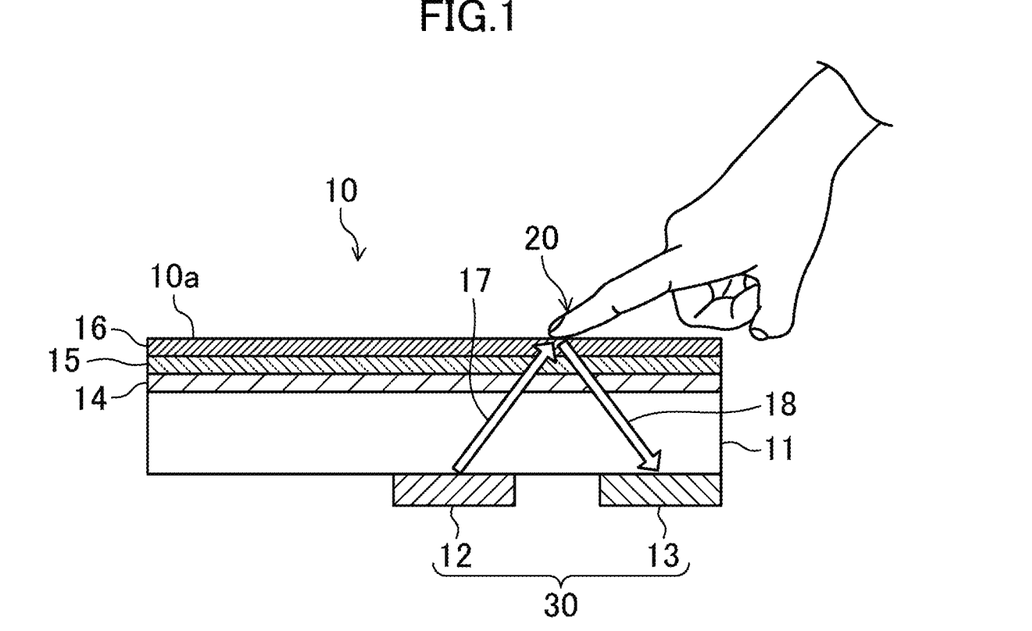
FIG. 1 is a schematic configuration diagram of an example OLED display with a fingerprint recognition system using a protective film according to an embodiment.
Figure 2:
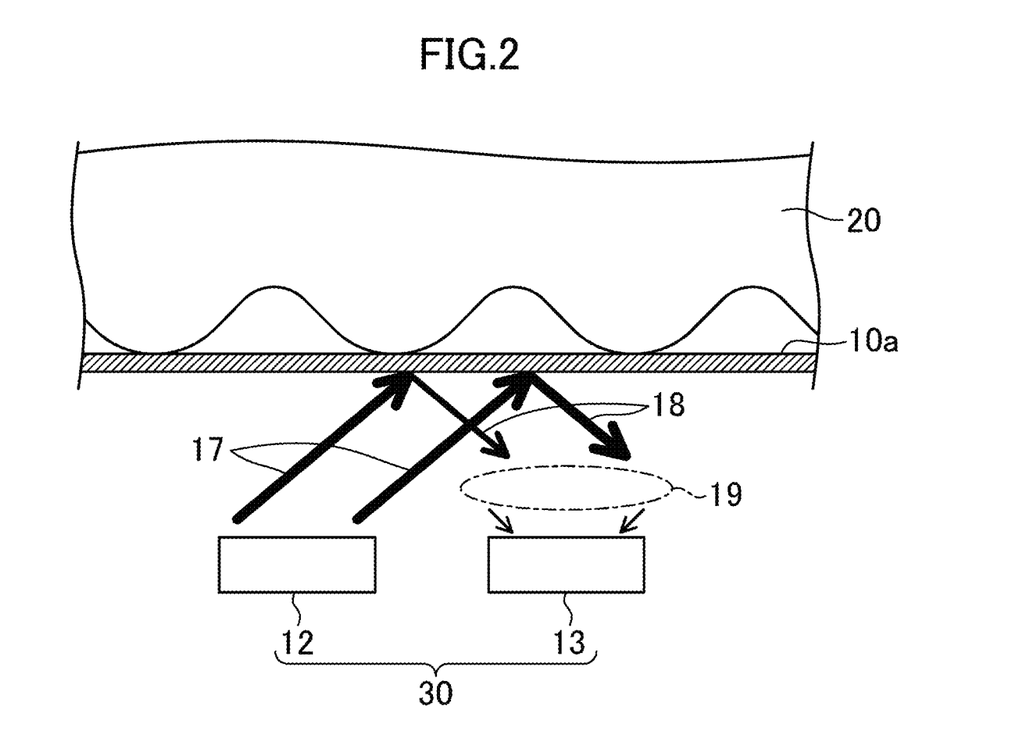
FIG. 2 shows a principle of fingerprint recognition performed by the fingerprint recognition system shown in FIG. 1.
Figure 3:
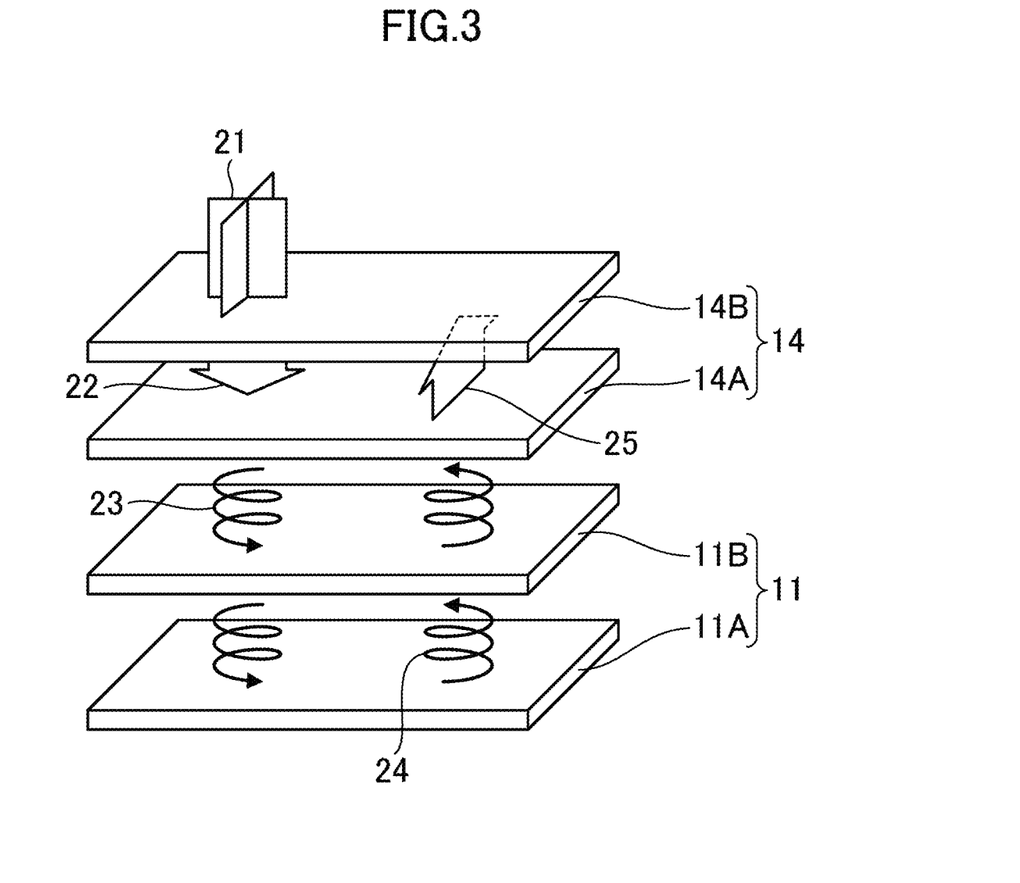
FIG. 3 is a schematic view of an OLED panel and a circular polarizer in the OLED display shown in FIG. 1.

FIG. 1 is a schematic configuration diagram of an example OLED display with a fingerprint recognition system using a protective film according to the embodiment. FIG. 2 shows a principle of fingerprint recognition performed by the fingerprint recognition system shown in FIG. 1. FIG. 3 is a schematic view of an OLED panel and a circular polarizer in the OLED display shown in FIG. 1.

As shown in FIG. 1, an OLED display 10 includes an OLED panel 11, a fingerprint recognition system 30, a circular polarizer 14, a cover member 15, and a protective film 16. The OLED panel 11 serves as a display screen. The fingerprint recognition system 30 is located under the OLED panel 11. The circular polarizer 14 is laminated on the OLED panel 11. The cover member 15 is laminated on the circular polarizer 14. The protective film 16 covers the surface of the cover member 15. The fingerprint recognition system 30 includes a light source 12 and an image sensor 13. The light source 12 irradiates a recognition target with light. The image sensor 13 receives reflected light from the recognition target. The circular polarizer 14 reduces reflection of external light incident on the OLED display 10. In the OLED display 10, the side viewed by a user is referred to as an "upper side" and the opposite as a "lower side."

In the fingerprint recognition system 30, as shown in FIGS. 1 and 2, once a person's finger 20 touches the surface (i.e., a recognition surface 10a) of the protective film 16, irradiation light 17 from the light source 12 is reflected by the recognition surface 10a touched by the finger 20. Reflected light 18 is received by the image sensor 13. At this time, total reflection occurs at concaves of the fingerprint of the finger 20 so that the amounts of the reflected light 18 and the irradiation light 17 are almost equal. On the other hand, diffuse reflection occurs at the convexes of the fingerprint of the finger 20 so that the amount of the reflected light 18 is smaller than that of the irradiation light 17. In this manner, the reflected light 18 received by the image sensor 13 produces a shadow 19 corresponding to the fingerprint shape of the finger 20. The fingerprint recognition system 30 records this shadow 19 using a processing circuit (not shown) and performs fingerprint recognition through matching of the shadow with fingerprint information registered in advance.

The OLED display 10 shown in FIG. 1 may be mounted on any type of information device such as a smartphone or a tablet terminal, which utilizes fingerprint recognition on the display screen to, for example, lock and unlock the device.

In this embodiment, the configuration of the OLED panel 11 is not particularly limited. For example, as shown in FIG. 3, the OLED panel 11 may include a cathode 11A on the opposite (i.e., back) side of the recognition surface 10a and an anode 11B facing the cathode 11A. The cathode 11A is a metal layer with a mirror surface, for example, whereas the anode 11B is an ITO layer, for example. Although not shown, for example, light-emitting layers associated with various colors and/or transport layers for holes or electrons are interposed between the cathode 11A and the anode 11B. A transparent member such as a glass substrate may be interposed between the anode 11B and the circular polarizer 14. In addition, the cathode 11A may not be formed at the installation locations of the light source 12 and the image sensor 13, that is, the installation location of the fingerprint recognition system 30.

As shown in FIG. 3, for example, the circular polarizer 14 may include a ¼ wavelength plate 14A on the OLED panel 11 and a linear polarizer 14B laminated on the ¼ wavelength plate 14A. A transparent member may be interposed between the ¼ wavelength plate 14A and the linear polarizer 14B.

The OLED panel 11 includes the metal layer with the mirror surface as the cathode 11A which is a back electrode. In the use for a mobile device, for example, which is often used under external light, the OLED display 10 includes the circular polarizer 14 to reduce reflection of the external light incident on the OLED display 10. As shown in FIG. 3, this principle allows the circular polarizer 14 to reduce the influence by the external light 21, which results in improvement in the visibility of the OLED display 10.

Specifically, passing through the linear polarizer 14B, the external light 21 becomes linearly polarized light 22. On the other hand, passing through the ¼ wavelength plate 14A, the light becomes circularly polarized light 23, which passes then through the anode 11B and is reflected by the cathode 11A. At this time, the reflected light becomes circularly polarized light 24 whose polarization direction is opposite to that of the circularly polarized light 23. After passing through the anode 11B and then through the ¼ wavelength plate 14A, the circularly polarized light 24 becomes linearly polarized light 25 whose polarization direction is different from that of the linearly polarized light 22 by 90°. Hence, this light is unable to pass through the linear polarizer 14B.

Note that, the light source 12 may be an LED, for example. The image sensor 13 may be of a charge-coupled device (CCD) type or a complementary metal-oxide-semiconductor (CMOS) type, for example. The material of the cover member 15 is not particularly limited, as long as being light transmissive, and may be glass or plastic, for example.

In this embodiment, the base layer of the protective film 16 is made of a film with an in-plane retardation value of 25 nm or less. The in-plane retardation value (Re) is obtained by the equation Re=(Ny−Nx)×d. Here, Nx is the refractive index of the film's fast axis, which is parallel to the film plane, Ny is the refractive index of the film's slow axis, which is also parallel to the film plane but perpendicular to the fast axis, and d is the thickness of the film.

The base layer of the protective film 16 may be made of a material containing, for example, a polycarbonate-based resin, an acrylic-based resin, a cycloolefin-based resin, or a polyester-based resin as a main component. This configuration allows production of a film with an in-plane retardation value of 25 nm or less using a known method such as a T-shaped die.

The base layer of the protective film 16 may include an ultraviolet absorber, a stabilizer, an antibacterial agent, a fungicide or any other agent as a component in addition to the main component.

The protective film 16 may have an adhesive layer formed on a first surface of the base layer described above. The first surface is a surface closer to the cover member 15, described above. This configuration facilitates attachment of the protective film 16 to the cover member 15. The adhesive layer may be made of a known adhesive resin such as an acrylic-based resin or an urethane-based resin.

The protective film 16 may include a hard coat layer that covers a second surface of the base layer other than the first surface described above The second surface is a surface farther from the cover member 15. This configuration increases the strength of the protective film 16. In one preferred embodiment, the hard coat layer has transparency, anti-scratch properties, chemical resistance, heat resistance, impact resistance, antifouling properties or anti-fingerprint properties, for example. For example, the hard coat layer may be made of a thermosetting resin or an active energy ray-curable resin.

If the protective film 16 includes an adhesive layer or a hard coat layer, attention needs to be paid to the thicknesses, materials, and production methods etc. of the adhesive layer and the hard coat layer so as not to increase the in-plane retardation value of the protective film 16 as a whole.

In the embodiment describe above, the base layer of the protective film 16 has a significantly low in-plane retardation value of 25 nm or less, which hardly causes a phase difference due to birefringence. Thus, in the use of the film as the protective film 16 for the OLED display 10, the amount of the light received by an image sensor 13 hardly changes, thereby reducing erroneous recognition.

In addition, according to this embodiment, the low in-plane retardation value reduces the influence of the dependency on the orientation of the base layer of the protective film 16. There is thus no need to specify the angle in punching a base material for the base layer in a size corresponding to a device to be used and to align the orientation axis of the film with the optical axis of the circular polarizer 14. This causes a less punching loss (unusable part). In addition, defective products attributed to a tolerance of the orientation axis of the film rarely occur, which leads to reduction in a low yield.

According to this embodiment, the OLED display 10 includes the protection film 16 as described above. This improve the accuracy in the fingerprint recognition by the fingerprint recognition system 30. Mounted with the OLED display 10 with the fingerprint recognition system 30 using the protective film 16, various information devices such as smartphones or tablet terminals perform highly accurate fingerprint recognition.

Figure 4:
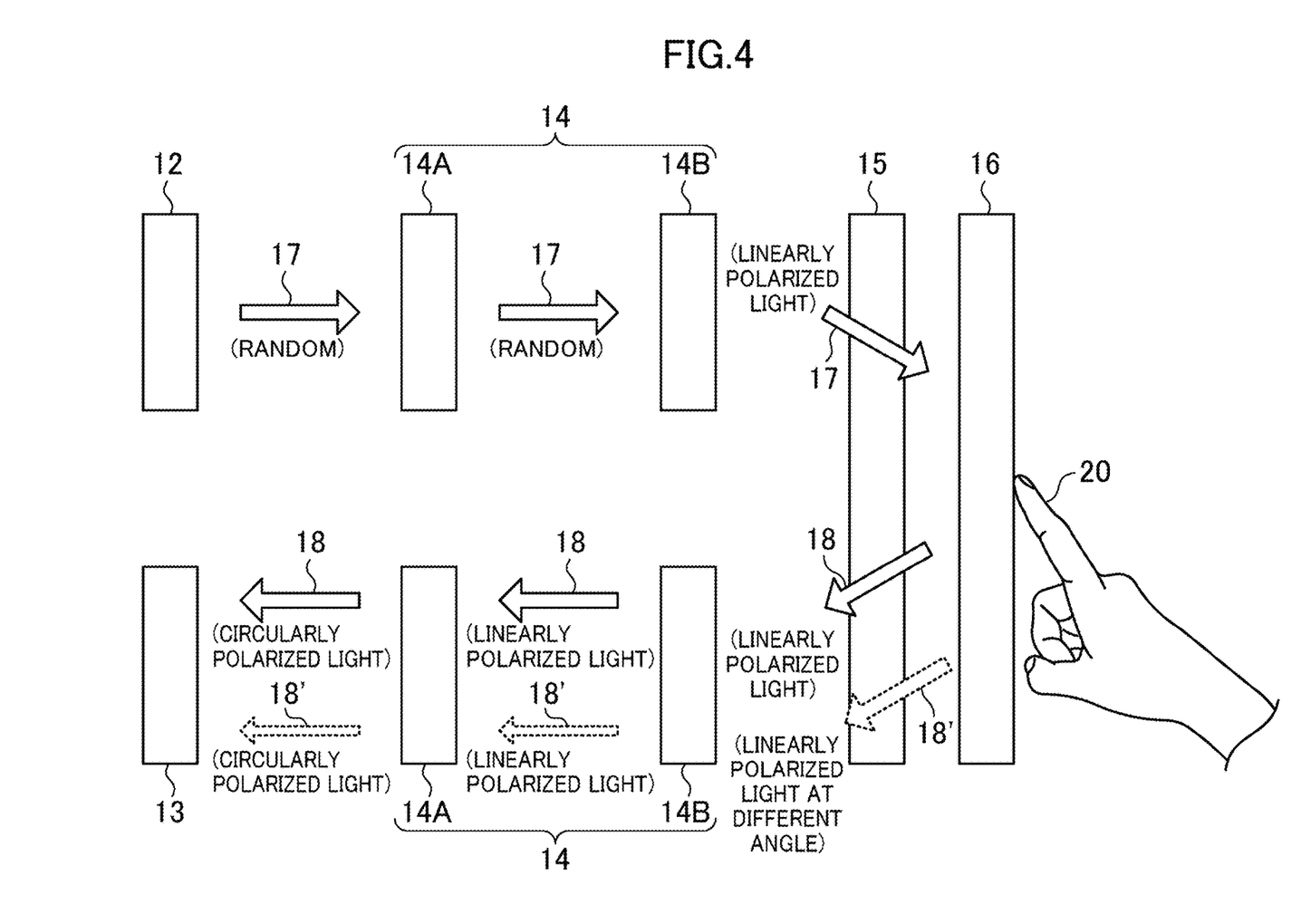
FIG. 4 shows an effect of the protective film according to the embodiment.

FIG. 4 shows an effect of the protective film 16 according to the embodiment. As shown in FIG. 4, the irradiation light 17 emitted from the light source 12 passes as random light through the ¼ wavelength plate 14A and then through the linear polarizer 14B so as to be linearly polarized light. The light passes through the cover member 15 and is then reflected by the surface of the protective film 16 touched by the finger 20. The reflected light 18 passes as linearly polarized light through the cover member 15 and the linear polarizer 14B and then through the ¼ wavelength plate 14A so as to be circularly polarized light, which is received by the image sensor 13.

In the fingerprint recognition, as described in connection with FIG. 2, it is ideal that the amount of the reflected light 18 changes only under the influence of the unevenness of the fingerprint of the finger 20. In reality, however, the protective film 16 is present, and the amount of the reflected light 18 is thus influenced by the state of polarization, that is, the phase difference of the protective film 16. Here, the phase difference (δ) is expressed by the equation $\delta = 2\pi \cdot Re/\lambda$, where Re is the in-plane retardation value and λ is the wavelength of light.

Like the protective film 16 of this embodiment, the phase difference decreases with a decrease in the in-plane retardation value. The amount of the reflected light 18 changes substantially under the influence of the unevenness of the fingerprint. As a result, accurate fingerprint shape is obtained by measuring the reflected light 18 using the image sensor 13. This improves the accuracy in the fingerprint recognition.

By contrast, assume that the protective film 16 is a typical protective film with a great in-plane retardation value. As shown in FIG. 4, the reflected light 18' reflected by the protective film 16 causes linearly polarized light at an angle different from that of the irradiation light 17 due to the phase difference of the protective film 16. Accordingly, the amount of the reflected light 18' decreases when the light passes through the linear polarizer 14B. That is, the amount of the reflected light 18' changes due to the phase difference of the protective film 16. This results in an inaccurate fingerprint shape and thus causes erroneous recognition.

Assume that, in the use of a typical protective film with a great in-plane retardation value, the amount of the reflected light decreases as described above in registering a fingerprint. In this case, the reflected light generates an unclear shade corresponding to the fingerprint shape, which may result in the problem of inaccurate fingerprint recognition.

EXAMPLES AND COMPARATIVE EXAMPLES

Hereinafter, examples and comparative examples will be described with reference to the drawings.

The in-plane retardation values (Re) of protective films (specifically, base layers) according to the examples and the comparative examples were measured using RE-200 manufactured by Otsuka Electronics Co., Ltd. In this measurement of Re, the measurement spot was 38.5 mm², the measurement wavelength was 550 nm, and the light source was an LED. In this measurement of Re, photonic crystal elements (or polarizing elements) are arranged at different angles. There is thus no need to rotate measured samples to measure the in-plane retardation values.

Figure 5:
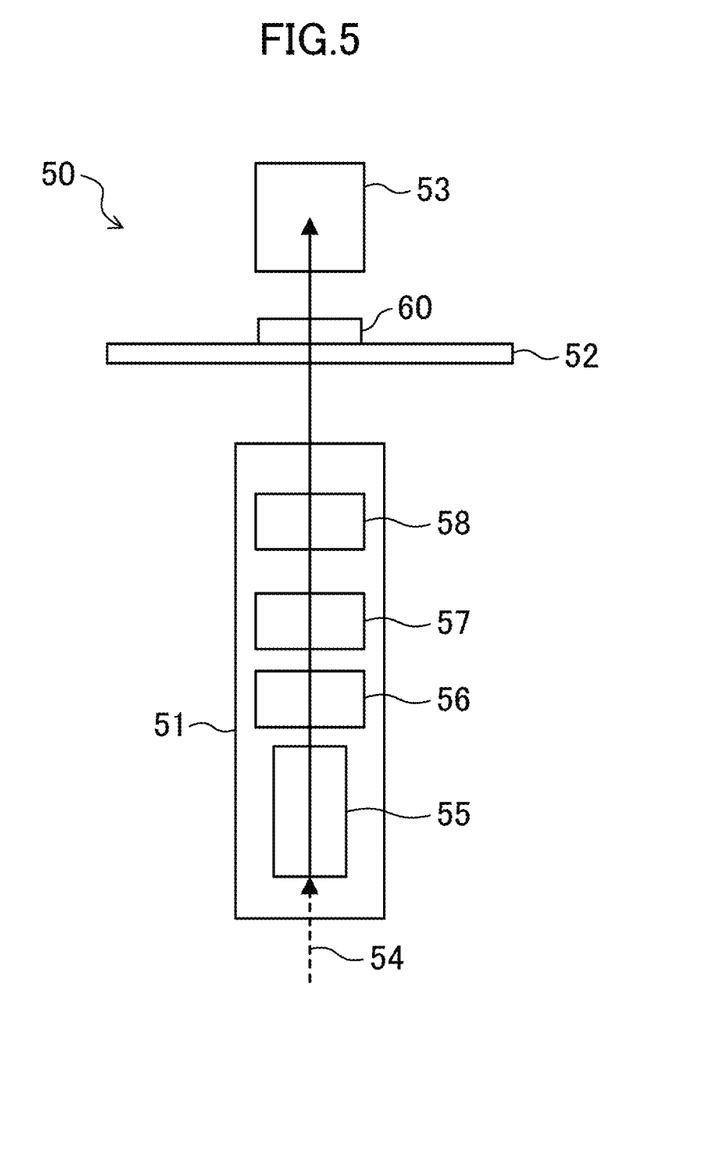
FIG. 5 is a schematic configuration diagram of a device used for measuring in-plane retardation values.

FIG. 5 is a schematic configuration diagram of a measuring device used for this measurement of Re. As shown in FIG. 5, a measuring device 50 includes a light-emitting head 51, a sample holder 52, and a light-receiving head 53. Measured samples 60 are placed on the sample holder 52. The light-receiving head 53 faces the light-emitting head 51 with the sample holder 52 interposed therebetween. The light-emitting head 51 includes a light-emitting fiber 54, a lens barrel 55, an interference filter 56 with a wavelength of 550 nm, a polarizer 57, and a wavelength plate 58 along the optical path. The light-emitting fiber 54 introduces light from a light source (LED). Each of the polarizer 57 and the wavelength plate 58 has a manually detachable mechanism. The light-receiving head 53 is a CCD camera.

In this measurement of Re, the measuring device 50 shown in FIG. 5 was used to measure the in-plane retardation values as follows. The light-emitting head 51 irradiated the measured samples 60 each cut into a size of 38.5 mm×38.5 mm with light having a wavelength of 550 nm. The light-receiving head 53 sensed polarization intensity patterns to measure the phase differences and the directions of the principal axes of the measurement samples 60.

Comparative Example 1

Comparative Example 1 was directed to a smartphone R17 manufactured by OPPO with a fingerprint recognition system. A protective film (specifically, SRF (registered trademark)) originally attached to this product was peeled off. Fingerprint recognition for unlock was then performed 20 times. The result of the fingerprint recognition is shown in Table 1. Note that fingerprint registration was performed with the protective film off.

Comparative Example 2

Comparative Example 2 was also directed to R17 manufactured by OPPO. The protective film, with Re of about 10000 nm, originally attached to this product was used as it was. Fingerprint recognition for unlock was then performed 20 times. The result of the fingerprint recognition is shown in Table 1. Note that fingerprint registration was performed with the protective film off.

Comparative Example 3

Comparative Example 3 was also directed to R17 manufactured by OPPO. The protective film originally attached to this product was attached again with a shift of 45°. Fingerprint recognition for unlock was then performed 20 times. The result of the fingerprint recognition is shown in Table 1. Note that fingerprint registration was performed with the protective film off.

Example 1

Example 1 was also directed to R17 manufactured by OPPO. The protective film originally attached to this product was replaced with a protective film (specifically, a base layer) of polycarbonate (specifically, CALIBRE (registered trademark) 301-15 manufactured by Sumika Polycarbonate Ltd.) with a thickness of 100 μm and Re of 1.9 nm. Fingerprint recognition for unlock was then performed 20 times. The result of the fingerprint recognition is shown in Table 1. Note that fingerprint registration was performed with the protective film off.

The protective film (specifically, the base layer) according this example was produced by the following method. First, pellet-like articles of a polycarbonate resin were extruded from an extruder set at 280° C. at an amount of discharge of 220 kg/h and pressed into a film using a touch roll and a pair of cast rolls.

The film was slowly cooled on a plurality of transfer rolls. Next, the cooled film was drawn off using a draw-off roll to obtain the polycarbonate resin film. The tension applied to the film at glass transition temperature Tg between −20° C. and +20° C. was reduced here to reduce the in-plane retardation value of the film. For example, the tension was controlled at 100 N/m or lower to reduce the in-plane retardation value of the film to about 30 nm or less.

Comparative Example 4

Comparative Example 4 was also directed to R17 manufactured by OPPO. The protective film originally attached to this product was replaced with a protective film that is a commercially available PET film, with a thickness of 150 μm and Re of 4033 nm. Fingerprint recognition for unlock was then performed 20 times. The result of the fingerprint recognition is shown in Table 1. Note that fingerprint registration was performed with the protective film off.

Comparative Example 5

Comparative Example 5 was also directed to R17 manufactured by OPPO. The protective film originally attached to this product was replaced with a protective film (specifically, a base layer) of polycarbonate (specifically, CALIBRE (registered trademark) 301-15 manufactured by Sumika Polycarbonate Ltd.) with a thickness of 100 μm and Re of 100 nm. Fingerprint recognition for unlock was then performed 20 times. The result of the fingerprint recognition is shown in Table 1. Note that fingerprint registration was performed with the protective film off.

Comparative Example 6

Comparative Example 6 was also directed to R17 manufactured by OPPO. The protective film originally attached to this product was replaced with a protective film (specifically, a base layer) of polyester (specifically, ALTESTER (registered trademark) 53000 manufactured by Mitsubishi Gas Chemical Company, Inc.) with a thickness of 300 μm and Re of 75 nm. Fingerprint recognition for unlock was then performed 20 times. The result of the fingerprint recognition is shown in Table 1. Note that fingerprint registration was performed with the protective film off.

(Evaluation on Example 1 and Comparative Examples 1 to 6)

TABLE 1

|  | Number of Unlock Failures |
| --- | --- |
| Comparative Example 1 | 0/20 |
| Comparative Example 2 | 0/20 |
| Comparative Example 3 | 5/20 |

TABLE 1-continued

| | Number of Unlock Failures |
|---|---|
| Example 1 | 0/20 |
| Comparative Example 4 | 7/20 |
| Comparative Example 5 | 4/20 |
| Comparative Example 6 | 2/20 |

As shown in Table 1, the protective film according to Example 1 caused no erroneous recognition (unlock failure), which was the case in Comparative Example 1 with the protective film off. On the other hand, in each of Comparative Examples 2 and 3, dependency of the recognition accuracy on the angle was found in the protective film originally attached to the product. In each of the other Comparative Examples 4 to 6, the large in-plane retardation value, that is, the large phase difference of the protective film reduced the accuracy in the fingerprint recognition.

Example 2

Example 2 was also directed to R17 manufactured by OPPO. The protective film originally attached to this product was replaced with a protective film (specifically, a base layer) of polycarbonate (specifically, CALIBRE (registered trademark) 301-15 manufactured by Sumika Polycarbonate Ltd.) with a thickness of 100 μm and Re of 1.9 nm. Fingerprint recognition for unlock was then performed 20 times. The result of the fingerprint recognition is shown in Table 2. Note that fingerprint registration was performed with the protective film replaced. The protective film according this example was produced by the same method as Example 1.

Example 3

Example 3 was also directed to R17 manufactured by OPPO. The protective film originally attached to this product was replaced with a protective film (specifically, a base layer) of polycarbonate (specifically, CALIBRE (registered trademark) 301-15 manufactured by Sumika Polycarbonate Ltd.) with a thickness of 100 μm and Re of 6.9 nm. Fingerprint recognition for unlock was then performed 20 times. The result of the fingerprint recognition is shown in Table 2. Note that fingerprint registration was performed with the protective film replaced. The protective film according this example was basically produced by the same method as Example 1.

Example 4

Example 4 was also directed to R17 manufactured by OPPO. The protective film originally attached to this product was replaced with a protective film (specifically, a base layer) of polycarbonate (specifically, CALIBRE (registered trademark) 301-15 manufactured by Sumika Polycarbonate Ltd.) with a thickness of 100 μm and Re of 10 nm. Fingerprint recognition for unlock was then performed 20 times. The result of the fingerprint recognition is shown in Table 2. Note that fingerprint registration was performed with the protective film replaced. The protective film according this example was basically produced by the same method as Example 1.

Example 5

Example 5 was also directed to R17 manufactured by OPPO. The protective film originally attached to this product was replaced with a protective film (specifically, a base layer) of polycarbonate (specifically, CALIBRE (registered trademark) 301-15 manufactured by Sumika Polycarbonate Ltd.) with a thickness of 100 μm and Re of 15 nm. Fingerprint recognition for unlock was then performed 20 times. The result of the fingerprint recognition is shown in Table 2. Note that fingerprint registration was performed with the protective film replaced. The protective film according this example was basically produced by the same method as Example 1.

Example 6

Example 6 was also directed to R17 manufactured by OPPO. The protective film originally attached to this product was replaced with a protective film (specifically, a base layer) of polycarbonate (specifically, CALIBRE (registered trademark) 301-15 manufactured by Sumika Polycarbonate Ltd.) with a thickness of 100 μm and Re of 17.5 nm. Fingerprint recognition for unlock was then performed 20 times. The result of the fingerprint recognition is shown in Table 2. Note that fingerprint registration was performed with the protective film replaced. The protective film according this example was basically produced by the same method as Example 1.

Example 7

Example 7 was also directed to R17 manufactured by OPPO. The protective film originally attached to this product was replaced with a protective film (specifically, a base layer) of polycarbonate (specifically, CALIBRE (registered trademark) 301-15 manufactured by Sumika Polycarbonate Ltd.) with a thickness of 200 μm and Re of 27.4 nm. Fingerprint recognition for unlock was then performed 20 times. The result of the fingerprint recognition is shown in Table 2. Note that fingerprint registration was performed with the protective film replaced. The protective film according this example was basically produced by the same method as Example 1.

Comparative Example 7

Comparative Example 7 was also directed to R17 manufactured by OPPO. The protective film originally attached to this product was replaced with a protective film (specifically, a base layer) of polycarbonate (specifically, CALIBRE (registered trademark) 301-15 manufactured by Sumika Polycarbonate Ltd.) with a thickness of 200 μm and Re of 35 nm. Fingerprint recognition for unlock was then performed 20 times. The result of the fingerprint recognition is shown in Table 2. Note that fingerprint registration was performed with the protective film replaced.

Comparative Example 8

Comparative Example 8 was also directed to R17 manufactured by OPPO. The protective film originally attached to this product was replaced with a protective film (specifically, a base layer) of polycarbonate (specifically, CALIBRE (registered trademark) 301-15 manufactured by Sumika Polycarbonate Ltd.) with a thickness of 300 μm and Re of 52.5 nm. Fingerprint recognition for unlock was then performed 20 times. The result of the fingerprint recognition is shown in Table 2. Note that fingerprint registration was performed with the protective film replaced.

Comparative Example 9

Comparative Example 9 was also directed to R17 manufactured by OPPO. The protective film originally attached to this product was replaced with a protective film (specifically, a base layer) of polyester (specifically, ALTESTER (registered trademark) 54500 manufactured by Mitsubishi Gas Chemical Company, Inc.) with a thickness of 275 μm and Re of 66 nm. Fingerprint recognition for unlock was then performed 20 times. The result of the fingerprint recognition is shown in Table 2. Note that fingerprint registration was performed with the protective film replaced.

Comparative Example 10

Comparative Example 10 was also directed to R17 manufactured by OPPO. The protective film originally attached to this product was replaced with a protective film (specifically, a base layer) of polyester (specifically, ALTESTER (registered trademark) 53000 manufactured by Mitsubishi Gas Chemical Company, Inc.) with a thickness of 300 μm and Re of 75 nm. Fingerprint recognition for unlock was then performed 20 times. The result of the fingerprint recognition is shown in Table 2. Note that fingerprint registration was performed with the protective film replaced.

Comparative Example 11

Comparative Example 11 was also directed to R17 manufactured by OPPO. The protective film originally attached to this product was replaced with a protective film (specifically, a base layer) of polycarbonate (specifically, CALIBRE (registered trademark) 301-15 manufactured by Sumika Polycarbonate Ltd.) with a thickness of 100 μm and Re of 100 nm. Fingerprint recognition for unlock was then performed 20 times. The result of the fingerprint recognition is shown in Table 2. Note that fingerprint registration was performed with the protective film replaced.

Example 8

Example 8 was also directed to R17 manufactured by OPPO. The protective film originally attached to this product was replaced with a protective film (specifically, a base layer) of an acrylic resin (specifically, KZ-112 manufactured by Kaneka Corporation) with a thickness of 100 μm and Re of 1.2 nm. Fingerprint recognition for unlock was then performed 20 times. The result of the fingerprint recognition is shown in Table 2. Note that fingerprint registration was performed with the protective film replaced.

The protective film (specifically, the base layer) used in this example was produced under the conditions set so that the melt viscosity at a shear rate of 122 (1/s) was 2000 Pa·s or lower. The temperature of the cast rolls was set within the temperature Tg between −30° C. and +30° C. of the resin to form the film, thereby reducing the in-plane retardation value of the film.

Example 9

Example 9 was also directed to R17 manufactured by OPPO. The protective film originally attached to this product was replaced with a protective film (specifically, a base layer) of a cycloolefin-based resin (specifically, R5000 manufactured by JSR Corporation) with a thickness of 100 μm and Re of 7.4 nm. Fingerprint recognition for unlock was then performed 20 times. The result of the fingerprint recognition is shown in Table 2. Note that fingerprint registration was performed with the protective film replaced. The protective film according this example was basically produced by the same method as Example 8.

Example 10

Example 10 was also directed to R17 manufactured by OPPO. The protective film originally attached to this product was replaced with a protective film (specifically, a base layer) of a polyester-based resin (specifically, Tritan (registered trademark) TX2001 manufactured by Eastman Chemical Company) with a thickness of 100 μm and Re of 12.2 nm. Fingerprint recognition for unlock was then performed 20 times. The result of the fingerprint recognition is shown in Table 2. Note that fingerprint registration was performed with the protective film replaced. The protective film according this example was basically produced by the same method as Example 8.

(Evaluation on Examples 2 to 10 and Comparative Examples 7 to 11)

TABLE 2

| | Re | Success Rate at 20 times | Thickness | Material |
|---|---|---|---|---|
| Example 2 (1) | 1.9 | 100% | 100 μm | PC CALIBRE 301-15 by Sumika Polycarbonate Ltd. |
| Example 3 (2) | 6.9 | 100% | 100 μm | PC CALIBRE 301-15 by Sumika Polycarbonate Ltd. |
| Example 4 (3) | 10 | 100% | 100 μm | PC CALIBRE 301-15 by Sumika Polycarbonate Ltd. |
| Example 5 (4) | 15 | 100% | 100 μm | PC CALIBRE 301-15 by Sumika Polycarbonate Ltd. |
| Example 6 (5) | 17.5 | 100% | 100 μm | PC CALIBRE 301-15 by Sumika Polycarbonate Ltd. |
| Example 7 (6) | 27.4 | 100% | 200 μm | PC CALIBRE 301-15 by Sumika Polycarbonate Ltd. |
| Comparative Example 7 (7) | 35 | 95% | 200 μm | PC CALIBRE 301-15 by Sumika Polycarbonate Ltd. |
| Comparative Example 8 (8) | 52.5 | 90% | 300 μm | PC CALIBRE 301-15 by Sumika Polycarbonate Ltd. |
| Comparative Example 9 (9) | 66 | 85% | 275 μm | Polyester ALTESTER S4500 by Mitsubishi Gas Chemical Company, Inc. |
| Comparative Example 10 (10) | 75 | 75% | 300 μm | Polyester ALTESTER S3000 by Mitsubishi Gas Chemical Company, Inc. |
| Comparative Example 11 (11) | 100 | 65% | 100 μm | PC CALIBRE 301-15 by Sumika Polycarbonate Ltd. |
| Example 8 (12) | 1.2 | 100% | 100 μm | Acrylic Resin KZ-112 by Kaneka Corporation |
| Example 9 (13) | 7.4 | 100% | 100 μm | Cycloolefin-Based Resin R5000 by JSR Corporation |
| Example 10 (14) | 12.2 | 100% | 100 μm | Polyester-Based Resin Tritan TX2001 by Eastman Chemical Company |

As shown in Table 2, in each of Examples 2 to 10, the in-plane retardation value Re of the protective film (specifically, the base layer) is set to be smaller than 30 nm, which results in the 100% success rate in the fingerprint recognition. On the other hand, in each of Comparative Examples 7 to 11, the protective film (specifically, the base layer) has an in-plane retardation value Re greater than 30 nm. The success rate of fingerprint recognition decreases with an increase in the in-plane retardation value Re.

Figure 6:
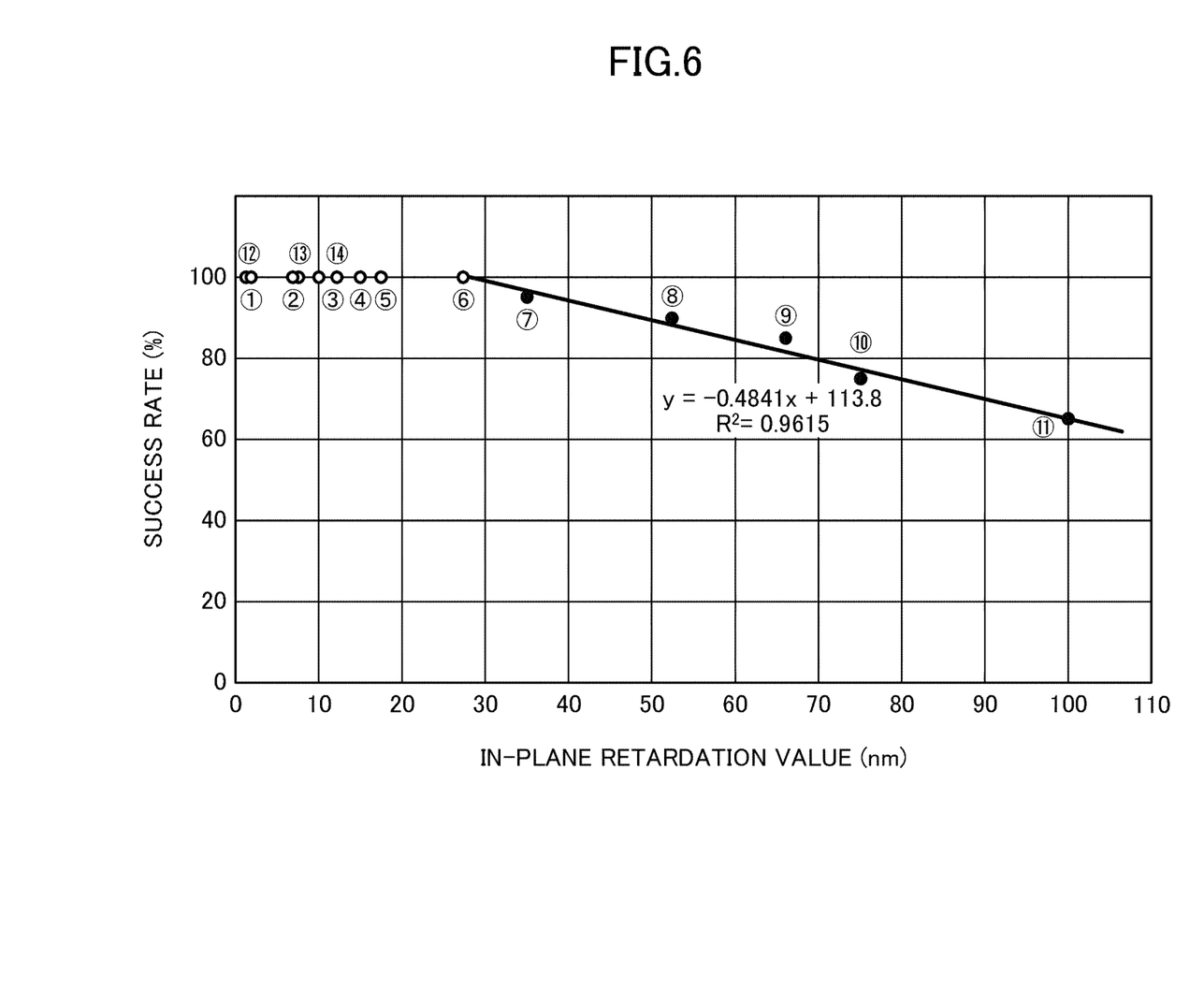
FIG. 6 shows the relationship between an in-plane retardation value of the protective film according to the embodiment and the success rate of fingerprint recognition.

FIG. 6 shows the relationship, obtained from the results shown in Table 2, between the in-plane retardation value of the protective film (specifically, the base layer) and the success rate of fingerprint recognition.

As shown in FIG. 6, in each of Examples 2 to 10 ((1) to (6) and (12) to (14) in the figure), the protective film (specifically, the base layer) has an in-plane retardation value Re smaller than 30 nm. The success rate of fingerprint recognition is 100% regardless of the magnitude of the in-plane retardation value Re. On the other hand, in each of Comparative Examples 7 to 11 ((7) to (11) in the figure), the protective film (specifically, the base layer) has an in-plane retardation value Re greater than 30 nm. In accordance with the relational expression y=−0.4841·x+113.8, where x is the in-plane retardation value and y is the success rate of fingerprint recognition, the success rate of fingerprint recognition decreases with an increase in the in-plane retardation value Re. In the use of this relational expression, x where y=100 is calculated, whereby 28.5 nm is obtained.

From the results described above, the following is found. In one preferred embodiment, the protective film (specifically, the base layer) may have an in-plane retardation value smaller than 30 nm to reduce erroneous fingerprint recognition. In view of including an adhesive layer and a hard coat layer, the in-plane retardation value may be smaller than 25 nm in one more preferred embodiment.

Example 11

Example 11 was also directed to R17 manufactured by OPPO. The protective film originally attached to this product was replaced with a protective film (a base layer only) of polycarbonate (specifically, CALIBRE (registered trademark) 301-15 manufactured by Sumika Polycarbonate Ltd.) with a thickness of 50 μm and Re of 7.3 nm. Fingerprint recognition for unlock was then performed 20 times. The result of the fingerprint recognition is, together with the haze value of the protective film, shown in Table 3. Note that fingerprint registration was performed with the protective film replaced. The protective film according to this example was basically produced by the same method as Example 1.

Example 12

Example 12 was also directed to R17 manufactured by OPPO. The protective film originally attached to this product was replaced with a protective film (a base layer only) of polycarbonate (specifically, CALIBRE (registered trademark) 301-15 manufactured by Sumika Polycarbonate Ltd.) with a thickness of 40 μm and Re of 6.4 nm. Fingerprint recognition for unlock was then performed 20 times. The result of the fingerprint recognition is, together with the haze value of the protective film, shown in Table 3. Note that fingerprint registration was performed with the protective film replaced. The protective film according to this example was basically produced by the same method as Example 1.

Example 13

Example 13 was also directed to R17 manufactured by OPPO. The protective film originally attached to this product was replaced with a protective film (a base layer only) of polycarbonate (specifically, CALIBRE (registered trademark) 301-15 manufactured by Sumika Polycarbonate Ltd.) with a thickness of 30 μm and Re of 5.4 nm. Fingerprint recognition for unlock was then performed 20 times. The result of the fingerprint recognition is, together with the haze value of the protective film, shown in Table 3. Note that fingerprint registration was performed with the protective film replaced. The protective film according to this example was basically produced by the same method as Example 1.

Example 14

Example 14 was also directed to R17 manufactured by OPPO. The protective film originally attached to this product was replaced with a protective film (a base layer only) of an acrylic resin (specifically, KZ-112 manufactured by Kaneka Corporation) with a thickness of 40 μm and Re of 0.6 nm. Fingerprint recognition for unlock was then performed 20 times. The result of the fingerprint recognition is, together with the haze value of the protective film, shown in Table 3. Note that fingerprint registration was performed with the protective film replaced. The protective film according to this example was basically produced by the same method as Example 8.

Example 15

Example 15 was also directed to R17 manufactured by OPPO. The protective film originally attached to this product was replaced with a protective film with Re of 5.2 nm. The protective film was formed by coating a clear hard coat (specifically, TOMAX FA-3303 Clear manufactured by Nippon Kako Toryo Co., Ltd.) on the surface of a base layer of polycarbonate (specifically, CALIBRE (registered trademark) 301-15 manufactured by Sumika Polycarbonate Ltd.) with a thickness of 100 μm. Fingerprint recognition for unlock was then performed 20 times. The result of the fingerprint recognition is, together with the haze value of the protective film, shown in Table 3. Note that fingerprint registration was performed with the protective film replaced. The base layer of the protective film according to this example was basically produced by the same method as Example 1.

Example 16

Example 16 was also directed to R17 manufactured by OPPO. The protective film originally attached to this product was replaced with a protective film with Re of 7.8 nm. The protective film was formed by coating a hard coat (specifically, an anti-glare agent obtained by mixing TOMAX FA-3303M and TOMAX FA-3303 Clear both manufactured by Nippon Kako Toryo Co., Ltd.) on the surface of a base layer of polycarbonate (specifically, CALIBRE (registered trademark) 301-15 manufactured by Sumika Polycarbonate Ltd.) with a thickness of 50 μm. Fingerprint recognition for unlock was then performed 20 times. The result of the fingerprint recognition is, together with the haze value of the protective film, shown in Table 3. Note that fingerprint registration was performed with the protective film replaced. The base layer of the protective film according to this example was basically produced by the same method as Example 1.

Example 17

Example 17 was also directed to R17 manufactured by OPPO. The protective film originally attached to this product was replaced with a protective film with Re of 7.2 nm. The protective film was formed by coating a hard coat (specifically, an anti-glare agent obtained by mixing TOMAX FA-3303M and TOMAX FA-3303 Clear both manufactured by Nippon Kako Toryo Co., Ltd.) on the surface of a base layer of polycarbonate (specifically, CALIBRE (registered trademark) 301-15 manufactured by Sumika Polycarbonate Ltd.) with a thickness of 50 µm. Fingerprint recognition for unlock was then performed 20 times. The result of the fingerprint recognition is, together with the haze value of the protective film, shown in Table 3. Note that fingerprint registration was performed with the protective film replaced. The base layer of the protective film according to this example was basically produced by the same method as Example 1.

Example 18

Example 18 was also directed to R17 manufactured by OPPO. The protective film originally attached to this product was replaced with a protective film with Re of 7.4 nm. The protective film was formed by coating a hard coat (specifically, an anti-glare agent obtained by mixing TOMAX FA-3303M and TOMAX FA-3303 Clear both manufactured by Nippon Kako Toryo Co., Ltd.) on the surface of a base layer of polycarbonate (specifically, CALIBRE (registered trademark) 301-15 manufactured by Sumika Polycarbonate Ltd.) with a thickness of 50 µm. Fingerprint recognition for unlock was then performed 20 times. The result of the fingerprint recognition is, together with the haze value of the protective film, shown in Table 3. Note that fingerprint registration was performed with the protective film replaced. The base layer of the protective film according to this example was basically produced by the same method as Example 1.

Example 19

Example 19 was also directed to R17 manufactured by OPPO. The protective film originally attached to this product was replaced with a protective film with Re of 0.6 nm. The protective film was formed by coating a hard coat (specifically, an anti-glare agent obtained by mixing TOMAX FA-3303M and TOMAX FA-3303 Clear both manufactured by Nippon Kako Toryo Co., Ltd.) on the surface of a base layer of an acrylic resin (specifically, KZ-112 manufactured by Kaneka Corporation) with a thickness of 40 µm. Fingerprint recognition for unlock was then performed 20 times. The result of the fingerprint recognition is, together with the haze value of the protective film, shown in Table 3. Note that fingerprint registration was performed with the protective film replaced. The base layer of the protective film according to this example was basically produced by the same method as Example 8.

Example 20

Example 20 was also directed to R17 manufactured by OPPO. The protective film originally attached to this product was replaced with a protective film with Re of 0.6 nm. The protective film was formed by applying an anti-reflection agent (specifically, ELCOM P-5062 manufactured by JGC Catalysts and Chemicals Ltd.) on the surface of a base layer of an acrylic resin (specifically, KZ-112 manufactured by Kaneka Corporation) with a thickness of 40 µm. Fingerprint recognition for unlock was then performed 20 times. The result of the fingerprint recognition is, together with the haze value of the protective film, shown in Table 3. Note that fingerprint registration was performed with the protective film replaced. The base layer of the protective film according to this example was basically produced by the same method as Example 8. In this example application of the anti-reflection agent onto the surface of the protective film reduces the reflectance against the light with a wavelength of 550 nm to 1.0%.

(Evaluation on Examples 11 to 20)

TABLE 3

| | Re | Success Rate at 20 times | Thickness | Material | Haze |
|---|---|---|---|---|---|
| Example 11 | 7.3 | 100% | 50 µm | PC CALIBRE 301-15 by Sumika Polycarbonate Ltd. | 1% or less |
| Example 12 | 6.4 | 100% | 40 µm | PC CALIBRE 301-15 by Sumika Polycarbonate Ltd. | 1% or less |
| Example 13 | 5.4 | 100% | 30 µm | PC CALIBRE 301-15 by Sumika Polycarbonate Ltd. | 1% or less |
| Example 14 | 0.6 | 100% | 40 µm | Acrylic Resin KZ-112 by Kaneka Corporation | 1% or less |
| Example 15 | 5.2 | 100% | 100 µm | PC CALIBRE 301-15 by Sumika Polycarbonate Ltd. Clear Hard Coat TOMAX FA-3303 Clear by Nippon Kako Toryo Co., Ltd. | 0.8% |
| Example 16 | 7.8 | 100% | 50 µm | PC CALIBRE 301-15 by Sumika Polycarbonate Ltd. Hard Coat Mixture of TOMAX FA-3303M and TOMAX FA-3303 Clear by Nippon Kako Toryo Co., Ltd. | 8% |

TABLE 3-continued

| | Re | Success Rate at 20 times | Thickness | Material | Haze |
|---|---|---|---|---|---|
| Example 17 | 7.2 | 100% | 50 μm | PC CALIBRE 301-15 by Sumika Polycarbonate Ltd. Hard Coat Mixture of TOMAX FA-3303M and TOMAX FA-3303 Clear by Nippon Kako Toryo Co., Ltd. | 13% |
| Example 18 | 7.4 | 100% | 50 μm | PC CALIBRE 301-15 by Sumika Polycarbonate Ltd. Hard Coat Mixture of TOMAX FA-3303M and TOMAX FA-3303 Clear by Nippon Kako Toryo Co., Ltd. | 18% |
| Example 19 | 0.6 | 100% | 40 μm | Acrylic Resin KZ-112 by Kaneka Corporation Hard Coat Mixture of TOMAX FA-3303M and TOMAX FA-3303 Clear by Nippon Kako Toryo Co., Ltd. | 18% |
| Example 20 | 0.6 | 100% | 40 μm | Acrylic Resin KZ-112 by Kaneka Corporation Anti-Reflection Agent ELCOM P-5062 by JGC Catalysts and Chemicals Ltd. | 1% or less |

As shown in Table 3, in each of Examples 11 to 14, the protective film had a smaller thicknesses than those in Examples 2 to 7 and 8. In these cases as well, the success rate of fingerprint recognition was 100%, when the in-plane retardation value Re was 25 nm or less. Furthermore, in each of Examples 15 to 20, the hard coat or the anti-reflection layer was laminated on the base layer. In these cases as well, the success rate of fingerprint recognition was 100%, when the in-plane retardation value Re was 25 nm or less.

In each of Examples 16 to 19, the hard coat other than the clear hard coat was applied onto the base layer. In each of these cases, the haze value was 20% or less, which was no problem in practical use. Further, the protective films in each of Examples 1 to 10, 11 to 15, and 20 other than Examples 16 to 19 had the haze value of 1% or less.

Other Embodiments

The embodiment of the present disclosure (including Examples. The same applies to the following) is described above. The present disclosure is however not limited to the embodiment described above. Various modifications may be made within the scope of the present disclosure. That is, the description of the embodiment is a mere example in nature and is not intended to limit the scope, applications, or use of the present disclosure.

For example, in the embodiment described above, the base layer of the protective film 16 is made of the material containing, for example, a polycarbonate-based resin, an acrylic-based resin, a cycloolefin-based resin, or a polyester-based resin as the main component. The material is not limited thereto. Even if made of any other material, the base layer, with an in-plane retardation value of 25 nm or less, of the film provides advantages similar to those of the embodiment. Even if the film base layer is stretched, the in-plane retardation value can be reduced to 25 nm or less with a proper configuration. For example, a new transparent optical resin "AZP (registered trademark)" manufactured by Asahi Kasei Corporation has no birefringence at a molecular level and thus has a retardation value of 25 nm or less even when being stretched into a film.

Needless to mention, the OLED display employing the protective film 16 is not limited to the OLED display 10 according to the embodiment described above.

It is also needless to mention that the fingerprint recognition system mounted on the OLED display is not limited to the fingerprint recognition system 30 according to the embodiment described above. In addition, the fingerprint recognition system 30 is located under the OLED panel 11 in the embodiment. Instead, for example, the fingerprint recognition system 30 may be located on a side of the OLED panel 11, or the end of the OLED panel 11 may be cut out to dispose the fingerprint recognition system 30.

What is claimed is:

1. A protective film for an organic light-emitting diode (OLED) display with a fingerprint recognition system, the protective film covering a surface of a cover member of the OLED display and comprising:
    a base layer of resin with an in-plane retardation value of 27.4 nm or less,
    the OLED display further including an OLED panel and a circular polarizer above a top of the OLED panel,
    the cover member being a cover glass located above the circular polarizer, and
    the protective film covering a surface of the cover glass, the surface being the surface of the cover glass farthest from the circular polarizer.

2. The protective film of claim 1, wherein the fingerprint recognition system includes a light source configured to irradiate a recognition target with light, and an image sensor configured to receive reflected light from the recognition target, and the fingerprint recognition system is located below the OLED panel.

3. The protective film of claim 1, further comprising:
an adhesive layer formed on a first surface of the base layer, the first surface being a surface closer to the cover member.

4. The protective film of claim 1, further comprising:
a hard coat layer formed on a second surface of the base layer, the second surface being a surface farther from the cover member.

5. The protective film of claim 4, wherein the hard coat layer comprises at least one property selected from the group of: transparency, anti-scratch, chemical resistance, heat resistance, impact resistance, antifouling, and anti-fingerprint.

6. The protective film of claim 4, wherein the hard coat layer contains a thermosetting resin or an active energy ray-curable resin.

7. The protective film of claim 1, wherein the base layer contains a polycarbonate-based resin, an acrylic-based resin, a cycloolefin-based resin, or a polyester-based resin as a main component.

8. The protective film of claim 7, wherein the base layer comprises one or more of an ultraviolet absorber, a stabilizer, an antibacterial agent, and/or a fungicide.

9. The protective film of claim 7, wherein the base layer has a thickness of 100-200 μm.

10. The protective film of claim 1, wherein the base layer has a thickness of 100-200 μm.

* * * * *